United States Patent [19]
Garde

[11] Patent Number: 5,111,431
[45] Date of Patent: May 5, 1992

[54] REGISTER FORWARDING MULTI-PORT REGISTER FILE

[75] Inventor: Douglas Garde, Dover, Mass.

[73] Assignee: Analog Devices, Inc., Norwood, Mass.

[21] Appl. No.: 608,294

[22] Filed: Nov. 2, 1990

[51] Int. Cl.$^5$ ............................................. G11C 11/40
[52] U.S. Cl. ......................... 365/129.02; 365/129.08; 365/230.02; 365/230.03; 365/230.05
[58] Field of Search ................ 365/189.02, 230.05, 365/189.08, 230.02, 230.03

[56] References Cited

U.S. PATENT DOCUMENTS

| | | | |
|---|---|---|---|
| 4,535,428 | 8/1985 | Furman | 365/230.05 |
| 4,558,433 | 12/1985 | Bernstein | 365/230.05 |
| 4,811,296 | 3/1989 | Garde | 365/189.02 |

Primary Examiner—Joseph E. Clawson, Jr.
Attorney, Agent, or Firm—Wolf, Greenfield & Sacks

[57] ABSTRACT

A multi-port RAM register file adapted for flowing data directly from an input port of the register file to an output port of the register file and for simultaneously writing to a memory location in the register file. In addition to the RAM register, the apparatus includes, in a first embodiment, (1) first and second sets of multiplexers, the first set of multiplexers connected between the register file output ports on the one hand, and, on the other hand, the outputs of the second set of multiplexers and the RAM bit lines; the second set of multiplexers being connected between one input of the first set of multiplexers, as aforementioned, and the RAM register file input ports; and (3) flow-through address comparators for controlling the multiplexers. The bit buses of the RAM are driven directly from the register file input ports. In a second embodiment, the first and second multiplexers are combined, with the outputs of the RAM bit lines being connected to input of the combined multiplexer, and with the combined multiplexer forming a crossbar switch.

8 Claims, 4 Drawing Sheets

REGISTER FORWARDING MULTI-PORT REGISTER FILE

FIELD OF THE INVENTION

This invention relates to the field of memory systems in digital computers and, more specifically, to a random access read/write memory (RAM) device or system with multiple input and/or output ports. In current terminology, these devices are called multi-port register files. The invention provides a multi-port register file wherein information supplied to an input port thereof may be read out at one or more output ports thereof at the same time, or even before, it is written to a location in the memory.

BACKGROUND OF THE INVENTION

Typical prior art multi-port register files are shown in, for example, U.S. Pat. No. 4,535,428, issued Aug. 13, 1985 to Anatol Furman; and U.S. Pat. No. 4,558,433 issued Dec. 10, 1985 to Cary Bernstein. The disclosures of those patents are hereby incorporated by reference for background information.

Multi-port register files normally operate from a clock signal which controls the timing of reading and writing operations with respect to the register file's memory. Typically, the clock cycle establishes specific times when data can be written into the register file's memory and other times when data can be read from the register file's memory. For example, during the first half of a clock cycle, data may be written into the memory; and during the second half of the clock cycle, data may be read from the memory. Therefore, in such normal operation, when data is to be passed from a particular input port to a particular output port of the multi-port register file, the data must first be written into the RAM during one clock cycle and then read out from the RAM during the next (or a later) clock cycle.

Additional restrictions on read/write operation may be imposed by the internal architecture of these devices. As stated in the Bernstein and Furman patents, care must be taken in such multi-port register files to protect the integrity of the stored data during read and write operations. Normally, the bitlines in a RAM cell (i.e., the conductors over which data bits are supplied for writing to or reading from the cells) are pre-charged to a level corresponding to the complementary value of the cell data. If a number of ports are turned on simultaneously to access a given cell, though, that cell may lose its data. To avoid this loss of data, larger size, more elaborate cell structures may be used or cell access can be restricted to one set of bitlines at a time, with data being reapplied to the other ports as required, outside the RAM structure itself. That is, when an address coincidence is detected among the ports (indicating that two or more ports seek access to the same data cell), only one word line is enabled, limiting access to a single port. The port is selected according to a predetermined list of priorities. Comparators then switch an appropriate multiplexer so that the highest priority bitlines are also routed to the lower priority ports. Such operation is explained in greater detail in the Furman and Bernstein patents, incorporated by reference herein.

In general though, it is desirable (and even important) to be able to pass data from an input (or write) port of a multi-port register file to an output (or read) port thereof quickly—e.g., in the same cycle, instead of waiting for the usual delay of one or more cycles. This desired operation is referred to as "flow-through" of data. The multiple read inhibit scheme employed by Bernstein, Furman and others, however, imposes restrictions on the achievement of flow-through operation since they do not permit an input port and an output port simultaneously to access a single cell.

In U.S. Pat. No. 4,811,296, issued Mar. 7, 1989 and titled "Multi-Port Register File with Flow-Through of Data", I described an improved multi-port register file which allowed flow-through operation while inhibiting multiple read operation. This prior invention also permitted the data which was to be flowed-through to the output port to be concurrently written to a selected cell in the RAM, during the same half-cycle, since the flow-through occurred over the RAM s bit lines. The disclosure of U.S. Pat. No. 4,811,296 is hereby incorporated by reference for background information, but I expressly show that prior invention in FIG. 1, as well, for ease of reference.

While the invention of U.S. Pat. No. 4,811,296 provides a significant improvement over the prior art, I have sought, since making that invention, a way to achieve an even faster flow through of data in a multi-port register file.

Accordingly, it is an object of the present invention to provide an improved multi port register file which supports fast flow-through of data from an input port to an output port.

BRIEF SUMMARY OF THE INVENTION

The foregoing and other objects of the present invention are achieved with a multi-port RAM register file having, in a first embodiment: (1) a multi-port RAM; (2) a first set of multiplexers, termed input multiplexers; (3) a second set of multiplexers, termed output multiplexers, the output of each input multiplexer being connected to one input of an associated output multiplexer and the output of each such output multiplexer being connected to a respective one of the output ports of the register file, and another input of each output multiplexer being connected to a respective one of the output ports of the RAM; (4) logic for controlling the operation of the input and output multiplexers; and (5) address decoding logic for controlling the writing to the RAM. The logic for controlling the multiplexers comprises flow-through address comparators.

When the flow through address comparators detect a flow-through operation, they cause the output multiplexers to select as their inputs the signals from their associated input multiplexers, so that data flows directly from the input multiplexers to the output multiplexers without use of the RAM bit lines; indeed, the RAM itself is bypassed. Thus the data "flowed-through" from the register file inputs to its outputs is actually the data which will be written to the RAM during the next write cycle (i.e., the next half cycle); this is feasible since the data to be written to the RAM must be present at an inport port of the register file before the RAM write cycle can be commenced. During a write operation, the RAM input ports receive their data directly from the register file input ports, without going through the input multiplexers. Thus, write data may flow through to the register file output ports even before the RAM can write the data to its cells, with the write operation and the flow-through operation occurring independently. When the flow through address comparators do not detect a flow-through operation, the output multiplexers select as their inputs the associated RAM output ports.

In a second embodiment, the same objects are achieved in an arrangement which omits the output multiplexers. Each RAM output port is connected, instead, to an input of a respective one of the input multiplexers, and the output of each input multiplexer directly acts as a corresponding register file output port. Thus, if the input multiplexers of the first embodiment each had "n" inputs, the input multiplexers of this second embodiment, as a group, must have not only n inputs, but also an additional number of inputs sufficient to accept the RAM output ports as inputs, as well.

This combination of the input multiplexers and output multiplexers of the first embodiment may be viewed as a (slightly incomplete) crossbar switch; the input multiplexer of the second embodiment directly implements that switch, with the RAM output ports simply being another set of inputs for the switch to select. The invention may thus be considered to employ a multi-port register file with a switch which can select for connection to each output port any of the register file input ports or at least one corresponding RAM output port. That is, each register file output port can be connected to at least one of the RAM output ports. Indeed, in the limiting case, each register file output port can be connected to only one predetermined RAM output port. Strictly speaking, therefore, this is not a full crossbar switch; each register file output port cannot be connected to some of the RAM output ports. Thus, I call this arrangement a modified crossbar switch.

The invention will be more fully understood from the detailed description set forth below, which should be read in conjunction with the accompanying drawing. The invention is defined in the claims appended at the end of the detailed description, such description being exemplary only.

DETAILED DESCRIPTION OF AN ILLUSTRATIVE EMBODIMENT

Figure 1:
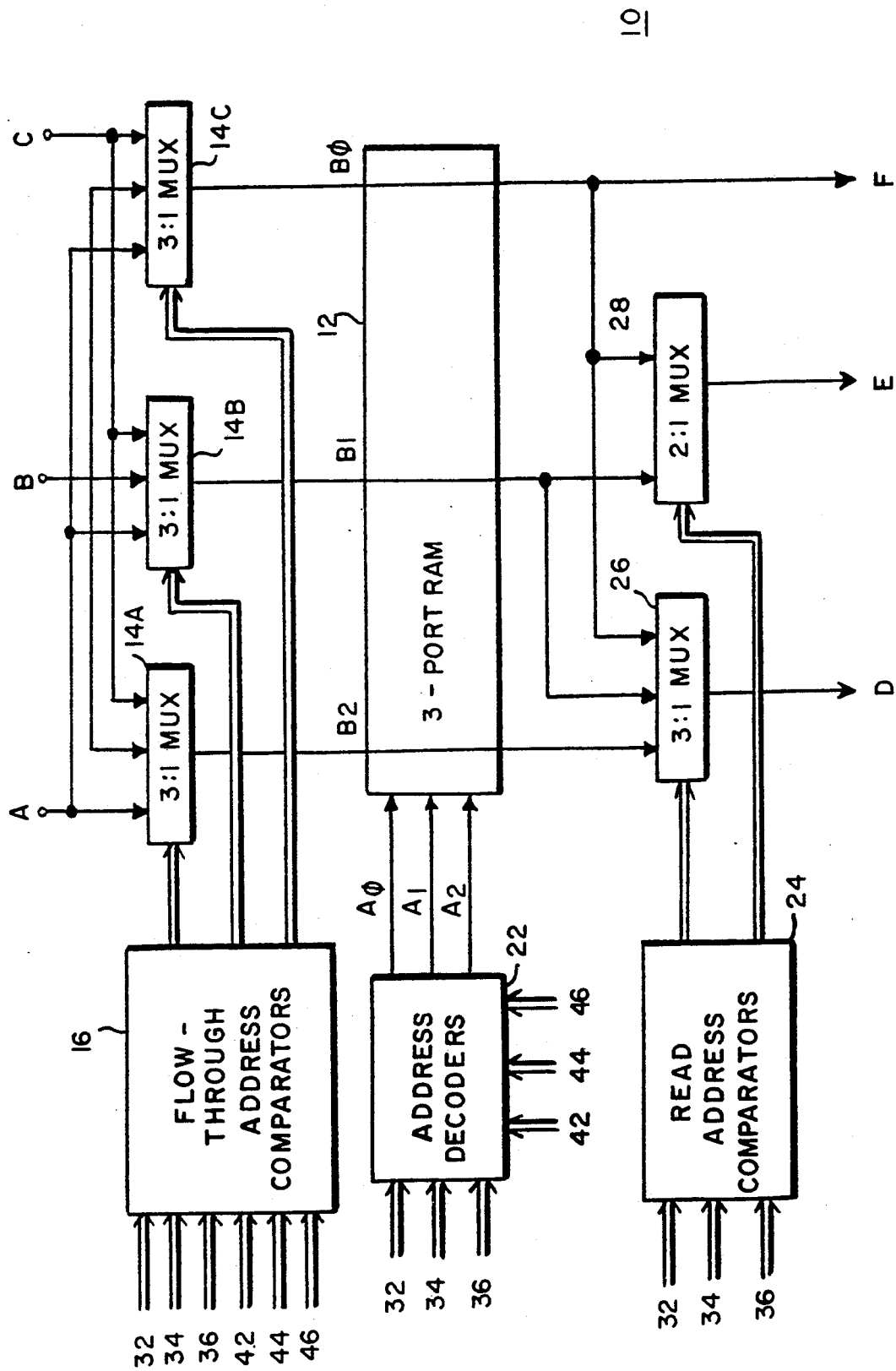
FIG. 1 is a block diagram of the prior art of U.S. Pat. No. 4,811,296.

To facilitate comparison, FIG. 1 shows the multi-port register file of my prior U.S. Pat. No. 4,811,296.

Figure 2:
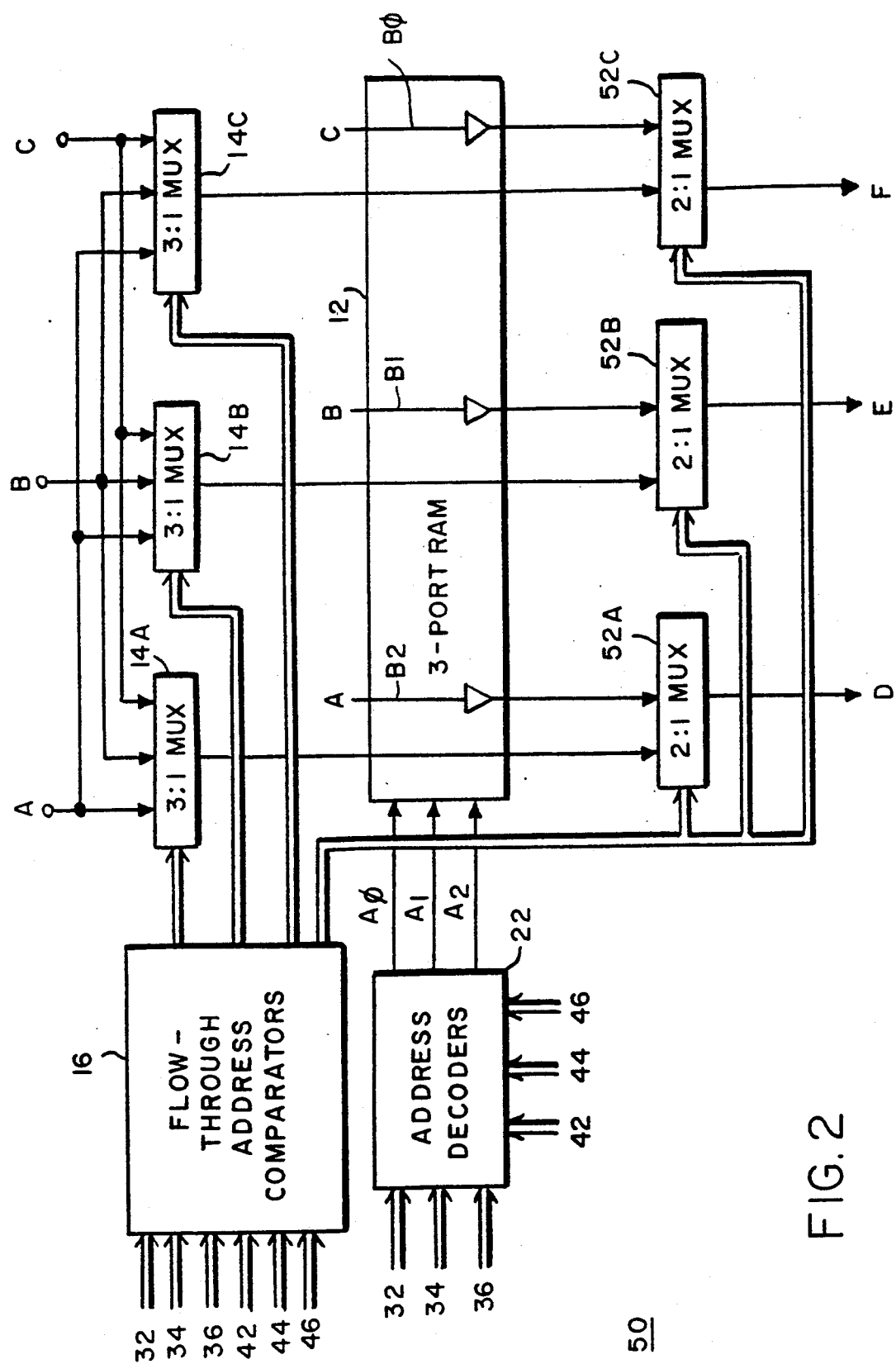
FIG. 2 is a block diagram of a first embodiment of a multi port register file according to the present invention.

FIG. 2 shows a first embodiment of a multi-port register file 50 according to the present invention. Like numerals and labels have been used in FIG. 2 to refer to elements having a correspondence to those in FIG. 1. For purposes of illustration, this register file is shown as having three input ports and three output ports and as using a three ported RAM 12 (i.e., a RAM having three input ports and three output ports), though the invention should be understood to be useful for an arbitrary number of RAM and register file input and output ports. The input ports to the register file 50 are labelled A, B and C; the output ports are labelled D, E, and F. The RAM 12 has three data buses, labelled B2, B1 and B0; the accesses to these buses provide the RAM s input and output ports.

The three register file input ports A, B and C are connected in parallel to the inputs of three 3:1 multiplexers 14A, 14B and 14C respectively, these being termed the input multiplexers. Correspondingly, three output multiplexers 52A, 52B and 52C are provided; they are all 2:1 multiplexers. Each input multiplexer is associated with a respective, corresponding one of the output multiplexers, the output of each input multiplexer being connected to one input of its corresponding output multiplexer. Thus, the output of multiplexer (MUX) 14A is connected to one input of MUX 52A, the output of MUX 14B is connected to one input of MUX 52B and the output of MUX 14C is connected to one input of MUX 52C. The second input of each of MUXs 52A, 52B and 52C is connected to a respective one of the RAM output ports. Thus, the second input of MUX 52A is connected to receive data from RAM data bus B2, the second input of MUX 52B is connected to receive data from RAM data bus B1 and the second input of MUX 52C is connected to receive data from RAM data bus B0.

The three register file output ports D, E and F are connected to the outputs of MUXes 52A, 52B and 52C, respectively.

MUXes 14A, 14B, 14C, 52A, 52B and 52C are controlled by a set of flow-through address comparators 16. Generally, as hereinafter described, the addresses compared by flow-through address comparators 16 will be the input and output addresses for RAM write and read operations. Alternatively, a special purpose controller may be provided for actuating the multiplexers.

An address decoder 22 controls the operation of writing to and reading from the RAM 12 in non-flow through operation, and of writing to the RAM for flow-through operation.

The exemplary register file 50 is provided with three sets of read address lines 32, 34, and 36 and three sets of write address lines 42, 44 and 46. The flow-through address comparators 16 are connected to these address lines to look for matches between read addresses and write addresses; the address decoder 22 also is connected to both the write address lines and the read address lines. During one half of the clock cycle (preferably the first half), the address decoder 22 operates on the write address lines and supplies a write address to the RAM; during the other half cycle, the address decoder operates on the read address lines and supplies a read address to the RAM. During the write half of the clock cycle, the address decoder looks for write operations involving the same locations as flow through operations.

To prevent the writing of data to a given location by more than one port attempting simultaneously to access such location, the input ports are assigned priorities. That is, if two or more sources are attempting to write data to the same location, flow-through address comparators 16 will detect that conflict and allow data to be written only through the highest (or, if there are only two input ports, higher) priority input port involved in the conflict. Assume that input port C has the highest priority, that input port B has the next lower priority and that input port A has the lowest priority. If two external devices (not shown) were simultaneously to supply data to input ports C and B while specifying to comparators 16 the same destination address in RAM 12, the comparators 16 would allow only the data at port C to be written to or through the RAM register file.

Whenever a read address supplied on read address lines 32, 34 or 36 corresponds to a write address supplied on one of write address lines 42, 44 or 46 (i.e., data is to be read from the same cell where data is to be written), a flow-through operation is to be performed. The comparators 16 then operate to control signals to the output MUXes to cause those MUXes to select for connection to the appropriate output port D, E or F the output of their corresponding input MUXes.

During a non-flow through read operation, the flow through address comparators provide to the output MUXes 52A, 52B and 52C appropriate control signals to cause those MUXes to select their other inputs for connection to the output ports—i.e., the RAM cell data supplied on RAM data buses B0, B1 and B2.

Figure 3:
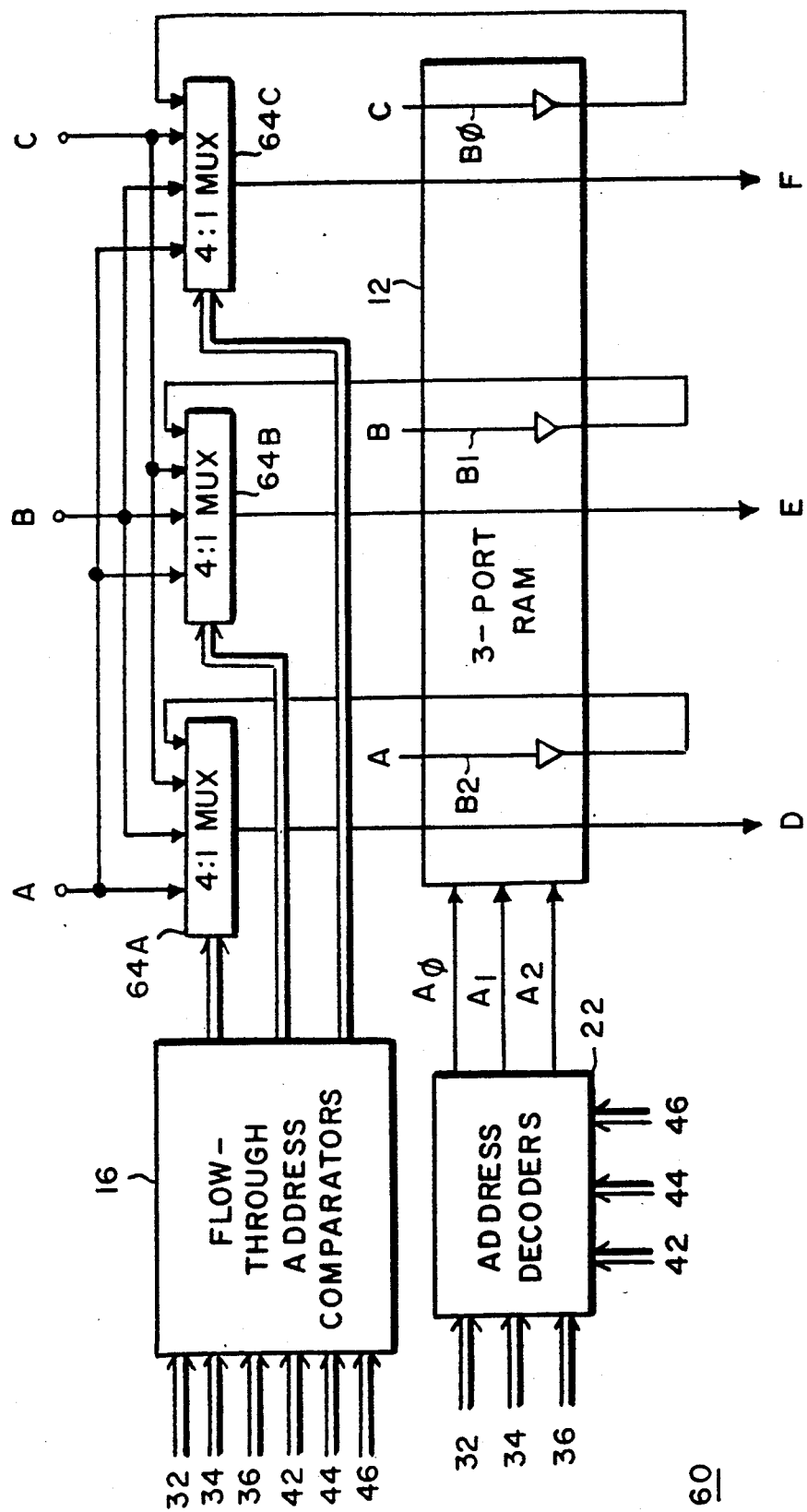
FIG. 3 is a block diagram of a second embodiment of a multi port register file according to the present invention.

A second embodiment of the invention is shown in FIG. 3. In this register file 60, the output MUXes 52A, 52B and 52C have been eliminated. Instead, the input MUXes 64A, 64B and 64C are now four-input MUXes (instead of three-input MUXes, as in FIG. 2) and the extra MUX input is connected to a corresponding one of the RAM output ports. Thus input MUX 64A, for example, supplies to register file output port D, for example, either the data at one of register file input ports A, B or C (during a flow-through operation) or the data from the RAM data bus B2 from the corresponding RAM output port (during a non flow through operation).

As stated above, the invention thus operates as a modified crossbar switch in combination with a RAM. Of course, if the added complexity can be tolerated, a full crossbar switch can be used instead of a modified crossbar switch; the two are fully equivalent and differ only in that a full crossbar will allow any RAM output port (or other input) to be connected to any register file output port. The general term "crossbar switch" is used herein to encompass both a modified crossbar switch and a full crossbar switch.

Figure 4:
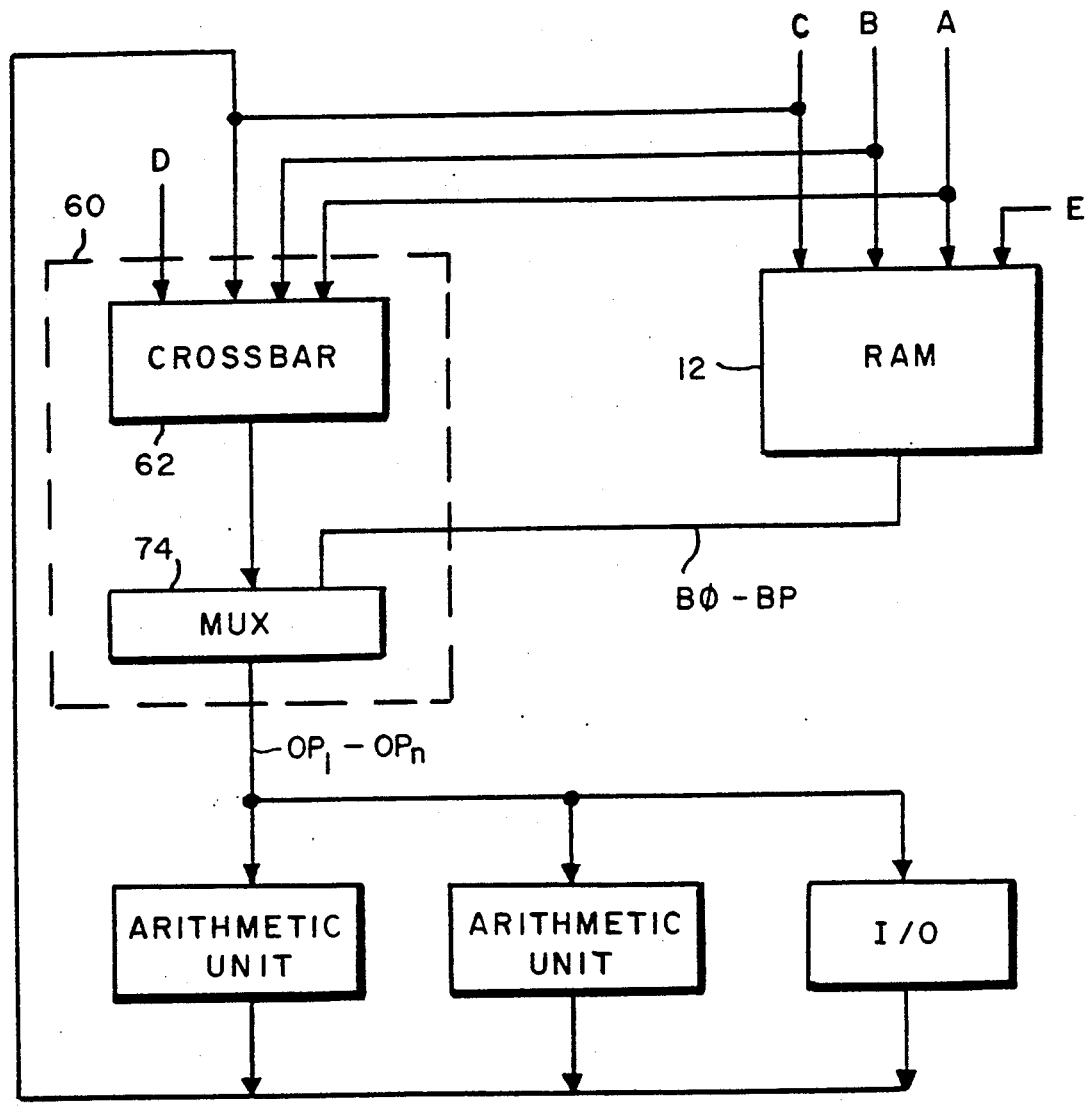
FIG. 4 is a block diagram of a modified crossbar switch for use in a multi port register file according to the present invention, essentially providing still a third embodiment.

FIG. 4 illustrates another way a modified crossbar switch can be implemented. The modified crossbar 60 is created from a full crossbar switch 62 and a multiplexer 64. The multiplexer selects for connection to the register file output ports $OP_1-OP_n$ either one of the signals from the register file input ports (A, B or C, for example) supplied by the crossbar switch 62, or one of the outputs B0-Bp from RAM 12. The number of RAM output ports connected to the multiplexer inputs is predetermined according to the user's requirements. The crossbar and the RAM may also receive inputs from other sources, such as the input port D (which supplies the crossbar but not the RAM) or the input E which supplies the RAM but not the crossbar, in which event the number of register file output ports may be correspondingly increased. Similarly, the full crossbar 62 may be expanded to a full crossbar, to accept all of these inputs, in which event the MUX 74 becomes unnecessary.

Having thus described three particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description presents the invention by way of example only, and the disclosed embodiments are not intended to be limiting. The invention is limited only as defined in the following claims and equivalents thereto.

What is claimed is:

1. A multi-port RAM register file comprising:
   a. a read/write memory (RAM) having a plurality of bit storage cells and a plurality of bit buses over which data may be written to or read from said bit storage cells, and, for each bit bus, a corresponding RAM output port the number of RAM output ports being identified by the variable "n";
   b. a plurality of input multiplexers, each having multiple inputs and an output, the number of such inputs corresponding to the number of input ports to be provided;
   c. each input of said input multiplexers being connected to a register file input port, such that each input multiplexer has an input connected to each of the input ports;
   d. n two input output multiplexers, each having one input connected to a different one of said bit buses and another input connected to the output of a different one of the input multiplexers;
   e. a plurality of register file output ports, each output port being connected to the output of one of the output multiplexers; and
   f. flow-through address comparator means for controlling the input and output multiplexers.

2. The multi-port RAM register file of claim 1, further including address decoder means operable in cooperation with the read/write memory to select addresses therein for reading and writing.

3. The multi port RAM register file of claim 2 further comprising the flow through address comparator means being operable to (i) receive at least one write address and at least one read address, (ii) compare said read addresses and said write addresses, and (iii) upon detecting a read address corresponding to a write address, to enable an appropriate one of the input multiplexers to steer input data from a selected one of the register file input ports to an input of one of the output multiplexers, and cause the output multiplexer to select that input for connection to an output port.

4. The multi-port RAM register file of claim 3 wherein the flow through address comparator means, when enabling one of the input multiplexers, selects the input multiplexer to be enabled according to a preestablished hierarchy of priorities among such multiplexers.

5. A multi-port RAM register file comprising:
   a. a read/write memory (RAM) having a plurality of bit storage cells and a plurality of bit buses over which data may be written to or read from said bit storage cells, and, for each bit bus, a corresponding RAM input port and a corresponding RAM output port, the number of RAM output ports being identified by the variable "n";
   b. at least n input multiplexers, each having multiple inputs and an output, the number of such inputs being at least equal to the number of input ports to be provided, plus one;
   c. each input multiplexer having an input connected to each of the register file input ports and an input connected to one of the RAM output ports;
   d. a plurality of register file output ports, the output of each of the input multiplexers being connected to one of the register file output ports;

e. each register file input port being connected to a respective one of the RAM input ports; and f. flow-through address comparator means for controlling the input and output multiplexers.

6. A multi-port RAM register file comprising:

a. a read/write memory (RAM) having a plurality of bit storage cells and a plurality of bit buses over which data may be written to or read from said bit storage cells, and, for each bit bus, a corresponding RAM input port and a corresponding RAM output port, the number of RAM output ports being identified by the variable "n";

b. a plurality of register file input ports and a corresponding plurality of register file output ports;

c. flow-through address comparator means for supplying signals for controlling the operation of the register file; and d. means operable in response to signals from the flow-through address comparator means to permit data presented to the register file input ports to be read from the register file output ports before it is written to the RAM input ports.

7. A multi-port register file according to claim 6 wherein the means operable in response to signals from the flow-through address comparator comprises a crossbar switch.

8. A multi-port register file according to claim 6 wherein the means operable in response to signals from the flow-through address comparator comprises a crossbar switch and a multiplexer, the multiplexer having at least one output port for supplying the register file output ports, at least one input port connected to receive output from the crossbar switch and at least one input port connected to receive data signals from the RAM output ports, and being operable to selectively connect to the multiplexer output either the outputs from the crossbar switch of the data from the RAM output ports.

* * * * *